US009959926B2

(12) United States Patent
Hebig et al.

(10) Patent No.: US 9,959,926 B2
(45) Date of Patent: May 1, 2018

(54) METHOD AND APPARATUS FOR SELECTIVE WRITE ASSIST USING SHARED BOOST CAPACITOR

(71) Applicant: Avago Technologies General IP (Singapore) Pte. Ltd., Singapore (SG)

(72) Inventors: Travis R. Hebig, Lakeville, MN (US); Daniel Mark Nelson, Minneapolis, MN (US); Richard J. Stephani, Saint Paul, MN (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days. days.

(21) Appl. No.: 14/919,533

(22) Filed: Oct. 21, 2015

(65) Prior Publication Data

US 2017/0117034 A1    Apr. 27, 2017

(51) Int. Cl.
*G11C 11/419* (2006.01)

(52) U.S. Cl.
CPC ................... *G11C 11/419* (2013.01)

(58) Field of Classification Search
CPC .................................................. G11C 11/419
USPC .......................................................... 365/154
See application file for complete search history.

(56) References Cited

U.S. PATENT DOCUMENTS

| 8,120,975 | B2* | 2/2012 | Kenkare | G11C 11/419 |
| | | | | 365/154 |
| 8,174,867 | B2* | 5/2012 | Wu | G11C 5/145 |
| | | | | 365/154 |
| 8,218,390 | B2* | 7/2012 | Nii | G11C 5/063 |
| | | | | 365/154 |
| 8,441,874 | B2* | 5/2013 | Sinha | G11C 7/227 |
| | | | | 365/194 |
| 8,625,333 | B2* | 1/2014 | Rao | G11C 11/419 |
| | | | | 365/154 |
| 9,324,392 | B1* | 4/2016 | Asenov | G11C 7/12 |
| 2006/0268626 | A1* | 11/2006 | Hamzaoglu | G11C 5/14 |
| | | | | 365/189.04 |
| 2009/0235171 | A1* | 9/2009 | Adams | G11C 7/1096 |
| | | | | 715/723 |
| 2010/0074032 | A1* | 3/2010 | Childs | G11C 5/145 |
| | | | | 365/189.08 |
| 2010/0329044 | A1* | 12/2010 | Yeung | G11C 8/16 |
| | | | | 365/189.16 |
| 2012/0140551 | A1* | 6/2012 | Arsovski | G11C 7/12 |
| | | | | 365/154 |
| 2012/0170388 | A1* | 7/2012 | Choi | G11C 11/413 |
| | | | | 365/189.16 |
| 2012/0170391 | A1* | 7/2012 | Janardan | G11C 7/04 |
| | | | | 365/194 |

(Continued)

*Primary Examiner* — Anthan Tran
*Assistant Examiner* — Mushfique Siddique
(74) *Attorney, Agent, or Firm* — Sterne, Kessler, Goldstein & Fox P.L.L.C.

(57) ABSTRACT

Write assist circuitry is disclosed to assist a memory device in changing logical states during a write operation. The write assist circuit includes write assist circuits which can be coupled to a shared boost capacitor to provide write assistance to the memory device. The write assist circuit includes boost switch circuit to selectively couple one or more of the write assist circuits and the shared boost capacitor. The one or more write assist circuits, when coupled to the shared capacitor, provide negative bitline assistance by selectively driving one of its corresponding bitlines pairs to be negative during a write operation.

20 Claims, 7 Drawing Sheets

(56) References Cited

U.S. PATENT DOCUMENTS

| | | | | |
|---|---|---|---|---|
| 2012/0206988 A1* | 8/2012 | Song | ................... | G11C 5/145 |
| | | | | 365/203 |
| 2014/0169106 A1* | 6/2014 | Kolar | ................... | G11C 7/12 |
| | | | | 365/189.02 |
| 2014/0219039 A1* | 8/2014 | Jung | ................... | G11C 7/12 |
| | | | | 365/189.16 |
| 2015/0138876 A1* | 5/2015 | Roy | ................... | G11C 7/18 |
| | | | | 365/154 |
| 2015/0206576 A1* | 7/2015 | Gong | ................... | G11C 7/12 |
| | | | | 365/154 |
| 2015/0255148 A1* | 9/2015 | Roy | ................... | G11C 11/4096 |
| | | | | 365/154 |
| 2016/0042784 A1* | 2/2016 | Rim | ................... | G11C 11/419 |
| | | | | 365/154 |

\* cited by examiner

US 9,959,926 B2

METHOD AND APPARATUS FOR SELECTIVE WRITE ASSIST USING SHARED BOOST CAPACITOR

BACKGROUND

Field

Embodiments described herein generally relate to a memory device, and including a negative bitline write assist circuitry for the memory device.

Background

Memory devices such as static read-access memory (SRAM) are common memory devices used by modern computer technologies to store data. In general, a memory device architecture includes an array of memory cells arranged in rows and columns. Each memory device includes circuitry, such as an arrangement of transistors, which read and write the data from and to, respectively, the array of memory cells. As new memory technologies allow for smaller memory devices and a supply voltage used by these new memory technologies is reduced, write operations to the array of memory cells become more challenging.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments. In the accompanying drawings.

The present disclosure will be described with reference to the accompanying drawings. The drawing in which an element first appears is typically indicated by the leftmost digit(s) in the corresponding reference number.

DETAILED DESCRIPTION

Exemplary Memory Device

Figure 1:
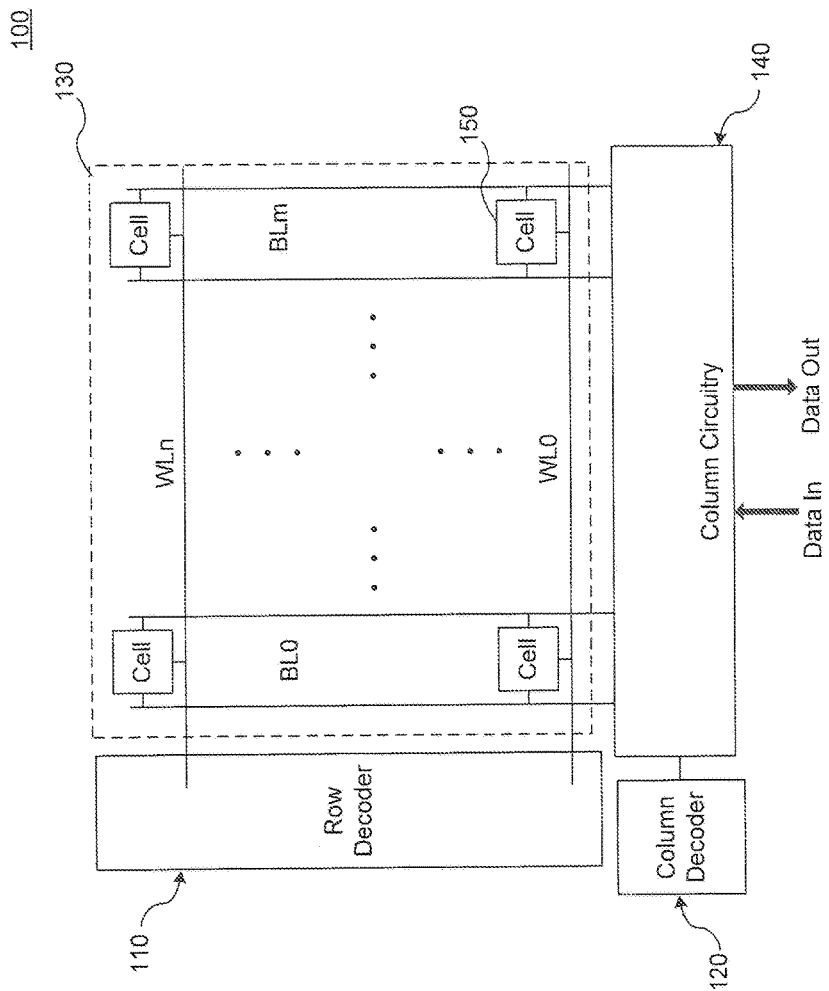
FIG. 1 illustrates a block diagram of a memory device in accordance with embodiments of the present disclosure.

FIG. 1 illustrates a block diagram of a memory device in accordance with embodiments of the present disclosure. In general, an architecture for a memory device 100 includes a row decoder 110, a column decoder 120, an array of memory cells 130, and column circuitry 140. As shown by FIG. 1, the array of memory cells 130 is arranged into rows and columns, where each row represents a string of data bits, also referred to a word, and each column is considered a bit of the word. In an exemplary embodiment, the array of memory cells 130 consists of n rows and m columns. To access a desired memory cell 150 from among the array of memory cells 130 via, for example, a read or write operation, the row decoder 110 accesses a row of the array of memory cells 130 corresponding to the desired memory cell 150 by asserting a corresponding wordline (WL) from among wordlines WL0 through WLn. The column decoder 120 selects one or more columns of the array of memory 130 within the row and one or more corresponding bitlines (BLs) from among bitlines BL0 through BLm. As illustrated in FIG. 1, each of the bitlines BL0 through BLm additionally includes a corresponding bitline $\overline{BL0}$ through $\overline{BLm}$, the bitlines $\overline{BL0}$ through $\overline{BLm}$ being respective complements of the bitlines BL0 through BLm. The bitlines BL0 through BLm and their corresponding bitlines $\overline{BL0}$ through $\overline{BLm}$ form bitline pairs BL0, $\overline{BL0}$ through BLm, $\overline{BLm}$. The column circuitry 140 provides data stored within the desired memory cell 150 during a read operation as "Data Out" or writes data received via "Data In" to the desired memory cell 150 during a write operation.

The column circuitry 140 includes write assist circuitry to assist the array of memory cells 130 to write the data to the desired memory cell 150. Each memory cell from among the array of memory cells 130 includes two pass-gate transistors coupled to cross coupled inverters which store data within the memory cell. During the write operation, the corresponding WL is activated to activate the two pass-gate transistors of the desired memory cell 150 allowing the data to pass through the two pass-gate transistors via the corresponding BL to be written into the desired memory cell 150. In some situations, such as those to be discussed below in FIG. 3A and FIG. 3B to provide an example, the desired memory cell 150 can experience difficulty in writing the data. This difficulty is especially prevalent when the data presently stored in the desired memory cell 150 is at a different logical value than the data to be written into the desired memory cell 150. When a first logical value is stored within the desired memory cell 150, the write assist circuitry assists the desired memory cell 150 in adjusting the first logical value to store a second logical value within the desired memory cell 150. For example, the write assist circuitry assists the desired memory cell 150 to write a logical zero into the desired memory cell 150 by pulling down the logical one when the desired memory cell 150 is presently storing the logical one.

Exemplary Memory Cell that can be Implemented as Part of the Memory Device

Figure 2:
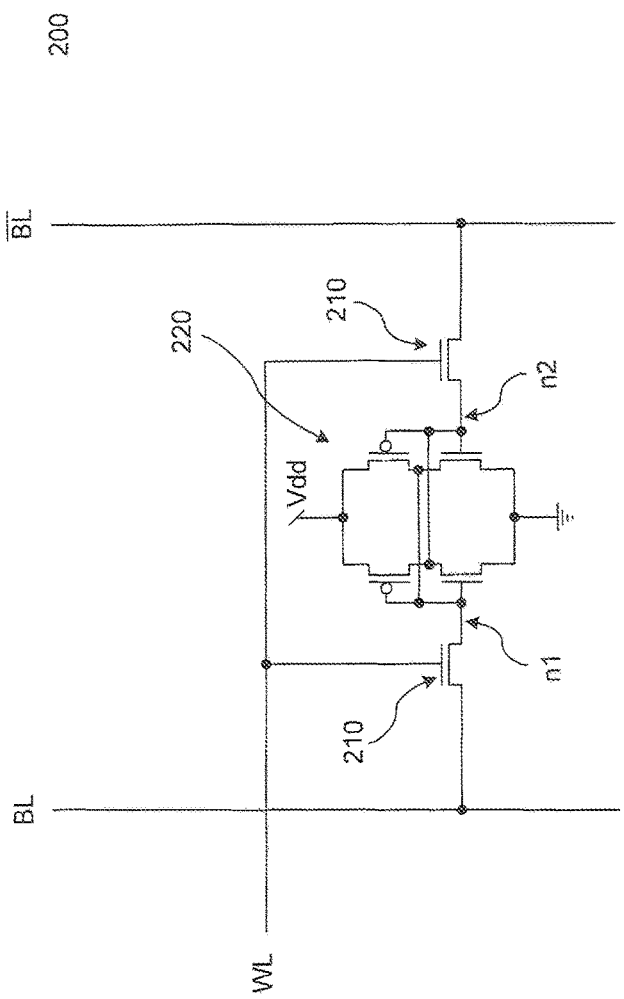
FIG. 2 illustrates a memory cell that can be implemented as part of the memory device according to an exemplary embodiment of the present disclosure.

FIG. 2 illustrates a memory cell that can be implemented as part of the memory device according to an exemplary embodiment of the present disclosure. As illustrated in FIG. 2, the SRAM cell 200 includes pass transistors 210 and cross coupled inverters 220 which contain paired NMOS and PMOS transistors. The pass transistors 210 and the cross coupled inverters 220 are coupled to each other at nodes n1, n2. During a write operation of the SRAM cell 200, bitlines BL and $\overline{BL}$ are driven to desired values based on data to be written into the SRAM cell 200. The bitlines BL and $\overline{BL}$ can represent an exemplary embodiment of one or more of the bitline pairs BL0. $\overline{BL0}$ through BLm, $\overline{BLm}$. For example, if a logical one is to be written, the bitline BL is driven to a logical one causing the bitline $\overline{BL}$ to be a logical zero, and if a logical zero is to be written, the bitline BL is driven to a logical zero causing the bitline $\overline{BL}$ to be a logical one. After the bitlines BL and $\overline{BL}$ have been driven to the desired value, wordline WL is asserted to a logical one which turns on the pass transistors 210 to store the logical one within the cross coupled inverters 220. The wordline WL can represent an exemplary embodiment of one or more of WL0 through WLn. However, during some write operations, the SRAM cell 200 is unable to store the logical one if a logical zero was previously stored in the SRAM cell 200 causing a write failure. While there are many reasons that a write failure may occur, a common reason in current technologies relates to manufacturing variations of transistors, such as the pass transistors 210 and/or the paired NMOS and PMOS transistors of the cross coupled inverters 220 to provide some examples. For example, after manufacturing, a transistor may have a strength higher or lower than a desired strength, where the strength of the transistor relates to an amount of current required for the transistor to transition from one state to another (e.g., a saturation state to a cutoff state). Accordingly, when a memory cell contains transistors with manufacturing variations, the memory cell may fail during a write operation when transitioning from one logical state to another logical state. Further, memory cells that are smaller is size (i.e., memory cells that contain transistors that are smaller in size) generally contain an increased amount of manufacturing variations, thus, a lower voltage used by the smaller sized memory cells exacerbates the transitioning issues caused by manufacturing variations.

Exemplary Write Operation of the Memory Cell

Figure 3B:
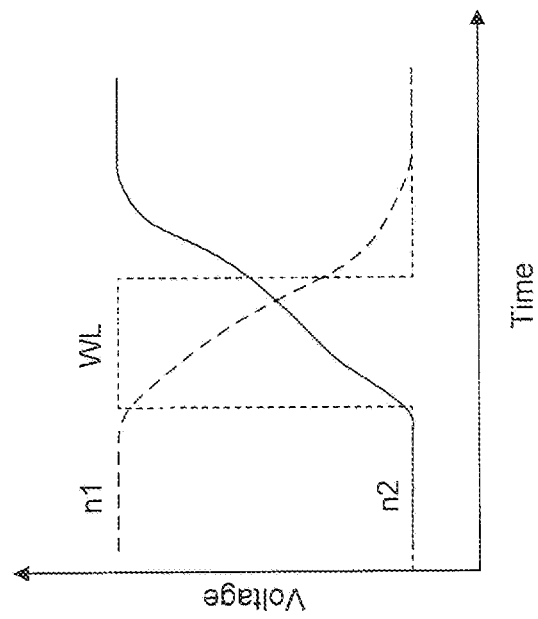
FIGS. 3A and 3B illustrate examples of a successful and an unsuccessful write operation of the SRAM cell, respectively.
Figure 3A:
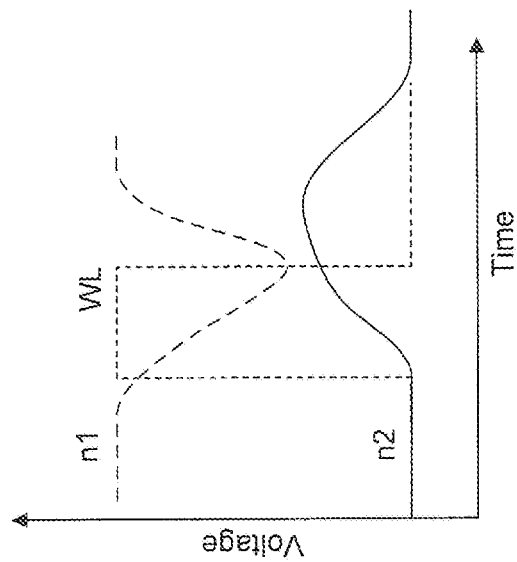

FIGS. 3A and 3B illustrate examples of a successful and an unsuccessful write operation of the SRAM cell 200, respectively. As shown by FIG. 3A, during a write operation for the SRAM cell 200, the wordline WL is driven to a logical one which causes voltages at nodes n1, n2 (shown in FIG. 2) to move towards each other and, based on a pulse width of the wordline WL, to eventually change between logical states, such as from a logical one to a logical zero or from a logical one to a logical zero. However, as illustrated by FIG. 3B, when the wordline WL is not asserted for a sufficient amount of time, nodes n1, n2 are unable to change logical states, and therefore the write operation fails.

Exemplary Write Assist Circuit that can be Implemented as Part of the Memory Device To overcome these issues, a memory device, such as the memory device 100 to provide an example, includes a write assist circuit. The write assist circuit assists the memory device in changing logical states, for example from a logical one to a logical zero, during a write operation. For example, the write assist circuit assists the SRAM cell 200 in changing the nodes n1, n2 between logical states, such as between a logical one and a logical zero to provide an example, during the write operation.

Figure 4:
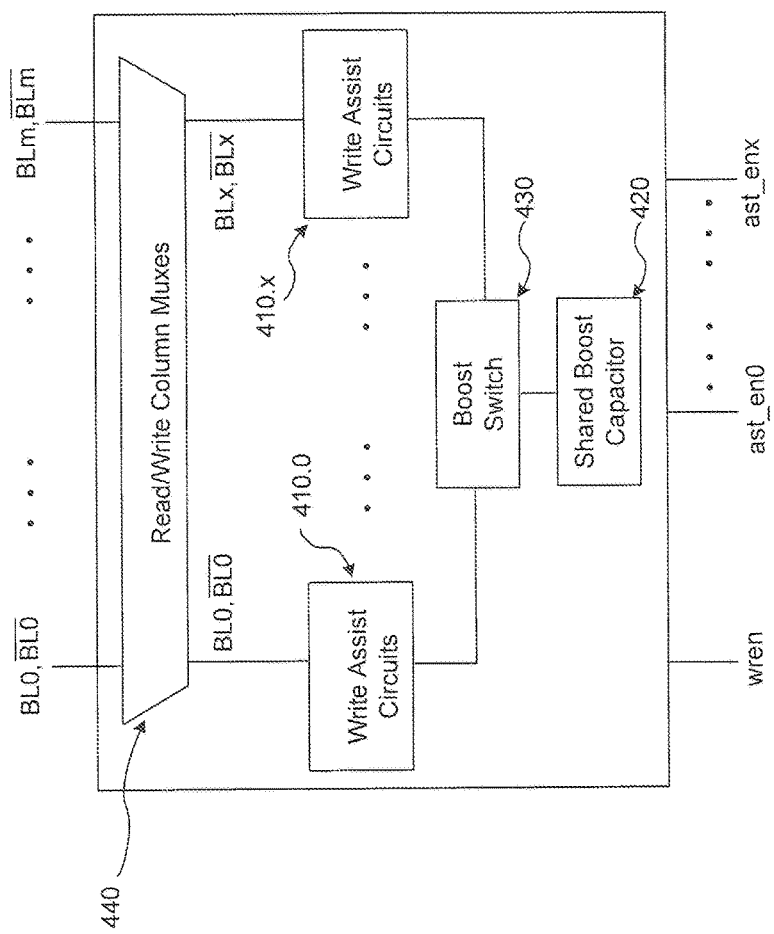
FIG. 4 illustrates a write assist circuit that can be implemented as part of the memory device according to an exemplary embodiment of the present disclosure.

FIG. 4 illustrates a write assist circuit that can be implemented as part of the memory device according to an exemplary embodiment of the present disclosure. Write assist circuitry 400 assists a memory device, such as the memory device 100 to provide an example, in changing logical states during a write operation. In an exemplary embodiment, the write assist circuitry 400 includes write assist circuits which can be selectively coupled to a shared boost capacitor to provide write assistance to the memory device. In another exemplary embodiment, the write assist circuitry 400 can be implemented within the memory device, such as within the column circuitry 140 of the memory device 100 to provide an example. As shown by FIG. 4, the write assist circuitry 400 includes write assist circuits 410.0 through 410.x, a shared boost capacitor 420, a boost switch circuit 430, and read/write column multiplexers 440.

The write assist circuits 410.0 through 410.x assist the memory device in changing the logical states during the write operation, where "x" can be related to a multiplexing ratio of a column decoding circuit, such as the column decoder 120 to provide an example, or any other suitable ratio that will be apparent to those skilled in the relevant art(s) without departing from the spirit and scope of the present disclosure. In an exemplary embodiment, the write assist circuitry 400 enters into the write operation by switching a write enable control line, denoted as wren in FIG. 4, from a first logical value, such as a logical zero to provide an example, to a second logical value, such as a logical one to provide an example. Each write assist circuit from among the write assist circuits 410.0 through 410.x is coupled to a corresponding bitline pairs BL0, $\overline{BL0}$ through BLx, $\overline{BLx}$ which corresponds to a column of an array of memory cells that is arranged into rows and columns. The write assist circuits 410.0 through 410.x can operate in an assistance mode of operation or in a non-assistance mode of operation. As additionally illustrated in FIG. 4, each write assist circuit from among the write assist circuits 410.0 through 410.x is also coupled to a corresponding write assist enable control line, denoted as ast_en in FIG. 4, from among write assist enable control lines, denoted as ast_en0 through ast_enx in FIG. 4. The write assist circuits 410.0 through 410.x can be configured to operate in the non-assistance mode of operation by switching their corresponding write assist enable control lines ast_en0 through ast_enx to a first logical value, such as a logical zero to provide an example. In the non-assistance mode of operation, the write assist circuits 410.0 through 410.x write data to their corresponding bitline pairs BL0, $\overline{BL0}$ through BLx, $\overline{BLx}$ without assistance. Alternatively, the write assist circuits 410.0 through 410.x can be configured to operate in the assistance mode of operation to provide write assistance to their corresponding columns of the array of memory cells by switching their corresponding write assist enable control lines ast_en0 through ast_enx to a second logical value, such as a logical one to provide an example.

In an exemplary embodiment, the write assist circuits 410.0 through 410.x can be implemented using negative bitline write assist circuits. Each of the negative bitline write assist circuits, when operating in the assistance mode of operation, selectively drives one of its corresponding bitlines pairs BL0, $\overline{BL0}$ through BLx, $\overline{BLx}$ to be negative during the write operation. In another exemplary embodiment, each of the negative bitline write assist circuits, when operating in the assistance mode of operation, selectively drives its complementary bitlines $\overline{BL0}$ through $\overline{BLx}$ to be negative during the write operation. Also in this other exemplary embodiment, only those complementary bitlines $\overline{BL0}$ through $\overline{BLx}$ on which a logical zero is to be written are driven negative during the write operation. The negativity of the complementary bitlines $\overline{BL0}$ through $\overline{BLx}$ increases a discharge rate of the columns of the array of memory cells allowing one or more memory cells from among the array of memory cells to change their logical states, for example, from logical one to logical zero, when one or more wordlines WLs corresponding to the one or more memory cells are asserted for a short amount of time. This allows these memory cells to store a logical one when a logical zero was previously stored which would have otherwise resulted in a write failure as discussed above in FIG. 3A and FIG. 3B.

As further illustrated in FIG. 4, the write assist circuits 410.0 through 410.x are selectively coupled to a shared boost capacitor 420 when operating in the assistance mode of operation. The shared boost capacitor 420 connects to corresponding bitline pairs BL0, $\overline{BL0}$ through BLx, $\overline{BLx}$ of write assist circuits 410.0 through 410.x operating in the assistance mode of operation to selectively drive the corresponding complementary bitlines $\overline{BL0}$ through $\overline{BLx}$ to be a negative voltage during the write operation. The changing of voltage at a first terminal of the boost capacitor 420 creates a negative voltage at a second terminal of the boost capacitor 420 which drives the corresponding complementary bitlines $\overline{BL0}$ through $\overline{BLx}$ below zero volts (i.e. negative). Because the write assist circuitry 400 includes the shared boost capacitor 420, significant area savings for a memory device are realized compared to an area used by multiple boost capacitors incorporated in a conventional memory device. Further, dynamic power savings are realized by the write assist circuitry 400 because write assist is enabled for only those columns that are known to need write assistance. The write assist circuitry 400 improves the reliability of the memory device because excessive voltage stress is not asserted on columns that do not need write assistance.

The boost switch circuit 430 selectively couples one or more of the write assist circuits 410.0 through 410.x and the shared boost capacitor 420. As illustrated in FIG. 4, the boost switch circuit 430 receives write enable control lines, denoted as wren in FIG. 4, and write assist enable control lines, denoted as ast_en0 through ast_enx in FIG. 4. The boost switch circuit 430 can selectively couple each write assist circuit from among the write assist circuits 410.0 through 410.x to the shared boost capacitor 420 by switching its corresponding write assist enable control line ast_en0 through ast_enx to a second logical value, such as a logical one to provide an example.

The read/write column multiplexers 440 selectively couple bitline pairs BL0, $\overline{BL0}$ through BLm, $\overline{BLm}$ to write assist circuits 410.0 through 410.x depending on the column decoding circuit, such as the column decoder 120 to provide an example. In an exemplary embodiment, the read/write column multiplexers 440 can be one or more multiplexers which connect two or more columns of memory cells, such as memory cells 130, for example, as will be apparent to those skilled in the relevant art(s) without departing from the spirit and scope of the present disclosure.

Exemplary Embodiment for the Write Assist Circuit

Figure 5A:
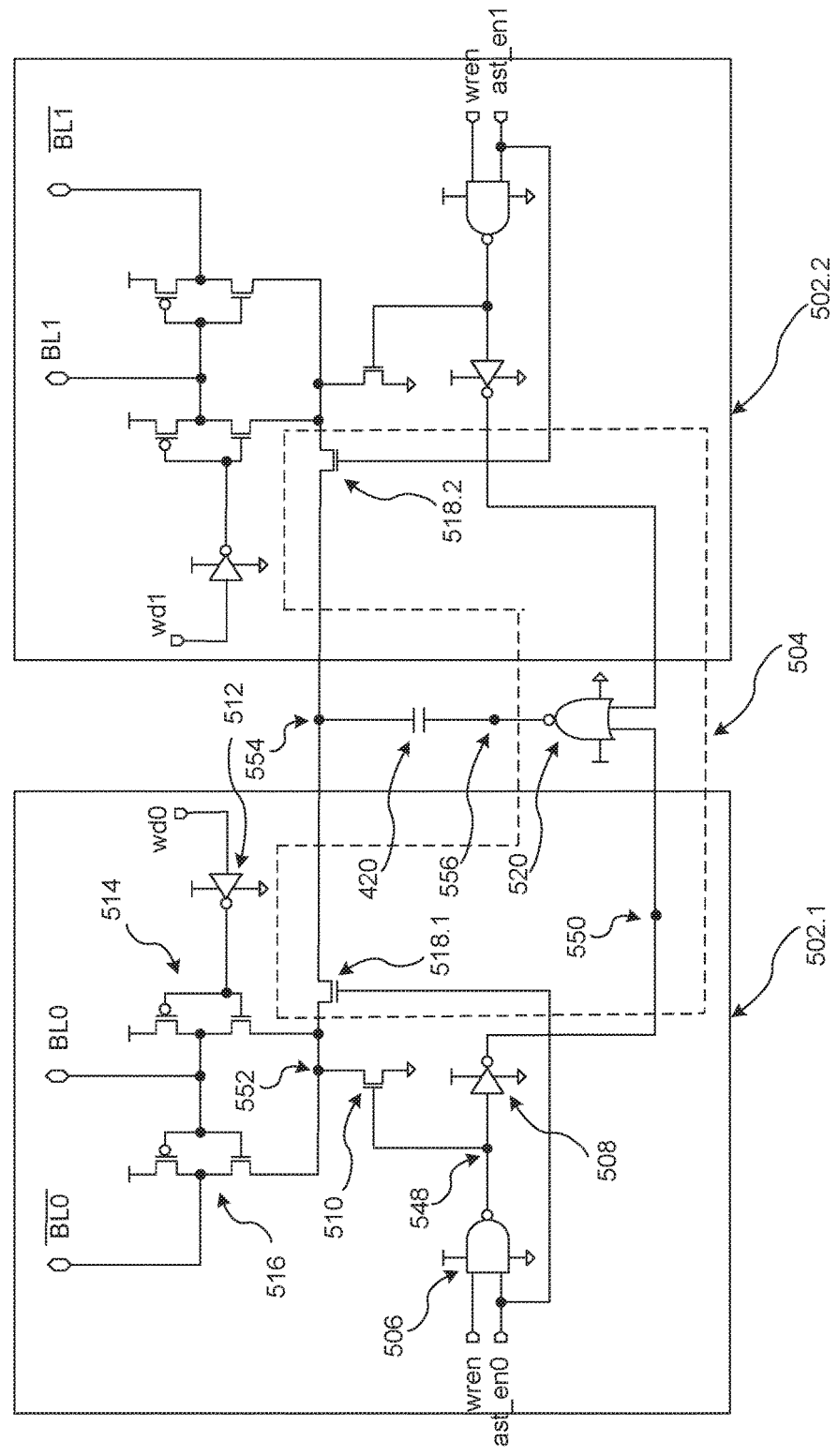
FIG. 5A illustrates a block diagram of an exemplary embodiment for the write assist circuit according to an exemplary embodiment of the present disclosure.
Figure 5B:
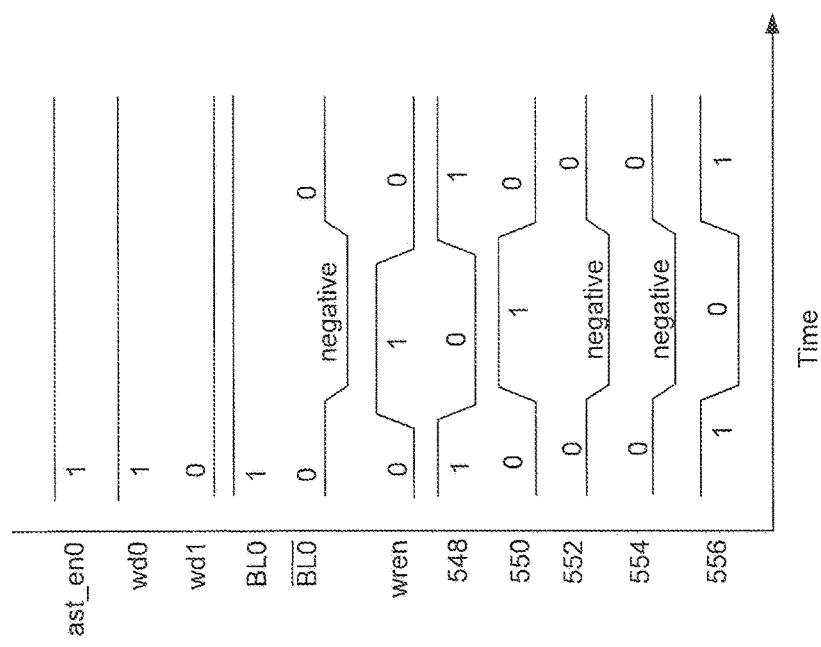
FIG. 5B illustrates a timing diagram of various signals within the write assist circuit according to an exemplary embodiment of the present disclosure.

FIG. 5A illustrates a block diagram of an exemplary embodiment for the write assist circuit according to an exemplary embodiment of the present disclosure and FIG. 5B illustrates a timing diagram of various signals within the write assist circuit according to an exemplary embodiment of the present disclosure. Write assist circuitry 500 assists a memory device, such as the memory device 100 to provide an example, in changing logical states during a write operation. In an exemplary embodiment, a write assist circuitry 500 includes write assist circuits which can be selectively coupled to a shared boost capacitor to provide write assistance to the memory device. In another exemplary embodiment, the write assist circuitry 500 can be implemented within the memory device, such as within the column circuitry 140 of the memory device 100 to provide an example. As shown by FIG. 5A, the write assist circuitry 500 includes the shared boost capacitor 420, write assist circuits 502.1 and 502.2, and a boost switch circuit 504. The write assist circuitry 500 can represent an exemplary embodiment of the write assist circuitry 400. As such, the write assist circuits 502.1 and 502.2 and the boost switch circuit 504 can represent exemplary embodiments of two of the write assist circuits 410.0 through 410.x and the boost switch circuit 430, respectively.

As illustrated in FIG. 5A, the write assist circuits 502.1 and 502.2 are coupled to bitline pairs BL0, $\overline{BL0}$ and BL1, $\overline{BL1}$, respectively. The bitline pairs BL0, $\overline{BL0}$ and BL1, $\overline{BL1}$ correspond to a first column and a second column, respectively, of an array of memory cells that is arranged into rows and columns. The write assist circuits 502.1 and 502.2 operate in a substantially similar manner. For simplicity, only the write assist circuits 502.1 is to be discussed in further detail below.

The write assist circuit 502.1 includes a first logical NAND gate 506, a first logical inverting gate 508, a write assist disable transistor 510, a second logical inverting gate 512, a bitline driver circuit 514, and an inverted bitline driver circuit 516. The first logical NAND gate 506 performs a logical NAND operation upon the write enable control line, denoted as wren in FIG. 5A, and a corresponding write assist enable control line, denoted as ast_en0 in FIG. 5A, from among write assist enable control lines ast_en0 through ast_enx. The write enable control line wren and the write assist enable control lines ast_en0 through ast_enx were previously described in FIG. 4. The first logical NAND gate 506 provides a logical zero at its output when the write enable control line wren and the write assist enable control line ast_en0 are at logical ones. Otherwise, the first logical NAND gate 506 provides a logical one at its output.

The first logical inverting gate 508 performs a logical inversion operation on the output of the first logical NAND gate 506. When an output of the first logical inverting gate 508 is at a logical one, the write enable control line wren and write assist enable control line ast_en0 are at logical ones.

The write assist disable transistor 510 couples the bitline driver circuit 514 and the inverted bitline driver circuit 516 to ground to disable write assistance or decouples the bitline driver circuit 514 and the inverted bitline driver circuit 516 from the ground to allow the write assist enable transistor 518 to enable write assistance as to be described in further detail below. The write assist disable transistor 510 disables write assistance when the write enable control line wren and write assist enable control line ast_en0 are at logical zeros.

The second logical inverting gate 512 performs a logic inversion operation on a write driver line, denoted as wd0 in FIG. 5A. During a write operation, the write driver line wd0 is asserted to either a logic one or a logic zero depending on a desired bit to write to a memory cell. For example, the write driver line wd0 is asserted to a logic one when a logic one is desired to be written to a memory cell. Accordingly, an output of the second logical inverting gate 512 is at a logical zero when the write driver line wd0 is a logic one.

The bitline driver circuit 514 drives the bitline BL0 to the desired bit to be written to the memory cell based on the write driver line wd0. The bitline driver circuit 514 comprises paired NMOS and PMOS transistors which perform an inversion operation on the output of the second logical inverting gate 512. When the write driver line wd0 is a logic one, the output BL0 of the bitline driver circuit 514 is a logic one that is to be written to a memory cell, such as memory cell 150.

The inverted bitline driver circuit 516 drives the bitline $\overline{BL0}$ to the inverted logic of the desired bit to be written to the memory cell. In other words, the bitline $\overline{BL0}$ is driven to the inverted logic of the bitline BL0 and the write driver line wd0. As an example, when the write driver wd0 is a logic one, the output of the inverted bitline driver circuit 516 is a logic zero. The inverted bitline driver circuit 516 comprises paired NMOS and PMOS transistors which perform the inversion operation on the output of the bitline driver circuit 514.

The boost switch circuit 504 selectively couples one or more of the write assist circuit 502.1 and the write assist circuit 502.2 to the shared boost capacitor 420. The boost switch circuit 504 includes a first write assist enable transistor 518.1, a second write assist enable transistor 518.2, and a first logical NOR gate 520. The first write assist enable transistor 518.1 performs a switching operation to connect/disconnect the bitline driver circuit 514 and the inverted bitline driver circuit 516 to a first terminal of the shared boost capacitor 420. The first write assist enable transistor 518.1 connects the bitline driver circuit 514 and the inverted bitline driver circuit 516 to the first terminal of the shared boost capacitor 420 when the write assist enable control line ast_en0 is at a logical one.

The second write assist enable transistor 518.2 performs a switching operation to connect/disconnect the write assist circuit 502.2 to the first terminal of the shared boost capacitor 420. The second write assist enable transistor 518.2 connects the write assist circuit 502.2 to the first terminal of the shared boost capacitor 420 when the write assist enable control line ast_en1 is at a logical one. Further explanation of the second write assist enable transistor 518.2 is provided in further detail below.

The first logical NOR gate 520 performs a logical NOR operation on the output of the first logical inverting gate 508. An output of the first logical NOR gate 520 is connected to a second terminal of the shared boost capacitor 420. When the output of the first logical NOR gate 520 is at a logical zero, the write enable control line wren and the write assist enable control line ast_en0 are at logical ones.

As described above, the first terminal of the shared boost capacitor 420 connects to the bitline driver circuit 514 and the inverted bitline driver circuit 516, by way of the first write assist enable transistor 518.1, and the second terminal of the shared boost capacitor 420 connects to the output of the first logical NOR gate 520.

Prior to a write operation being performed, the write enable control line wren is at logical zero and the write assist enable control line ast_en0 is at a logical one which causes the first terminal of the shared boost capacitor 420 to be grounded, by way of the write assist disable transistor 510 and the first write assist enable transistor 518.1, and the second terminal of the shared boost capacitor 420 is at a logic one by way of the NOR gate 520, which charges the shared boost capacitor 420 to the logical one voltage (e.g., 1V).

The write operation will now be discussed in reference to the voltage waveforms of FIG. 5B. During the write operation, the write enable control line wren transitions to a logical one and the write assist enable control line ast_en0 is at a logical one which causes the output of NAND gate 506 to transition to a logic zero. Accordingly, the write assist disable transistor 510 is cutoff so as to decouple the ground connection from the first terminal of the shared boost capacitor 420 (node 552). The output of the inverter 508 (node 550) transitions from a logic zero to a logic one which causes the output of the NOR gate 520 (node 556) to change from logic one to logic zero. The second terminal of the shared boost capacitor 420 (node 556) changes from a logical one to a logical zero based on the change of output from the first logical NOR gate 520. Because the voltage at the second terminal of the shared boost capacitor 420 (node 556) drops, the voltage at the first terminal of the shared boost capacitor 420 (node 554) likewise drops in a manner that maintains the relative voltage difference between the two terminals, at least for a period of time due to the hysteresis property of the capacitor. In this case, when the voltage at the second terminal of the shared boost capacitor 420 (node 556) drops from a logical one voltage to a logical zero voltage (e.g., 1V to 0V), the voltage at the first terminal of the shared boost capacitor 420 (node 554) drops from a logical zero voltage to a negative of the logical one voltage (e.g., 0V to −1V). This negative voltage is then provided as a source voltage to bit line driver circuits 514 and 516 for write assist to one of bitlines BL0 or $\overline{BL0}$ because transistor 518.1 is turned on by write enable control line ast_en0.

As described above, during a write operation the write driver line wd0 is either a logic one or a logic zero depending on a desired bit to write to a memory cell. Accordingly, one of the bitline driver circuit 514 and the inverted bitline driver circuit 516 is driven to a logical one and the other is driven to a logical zero. Because both the bitline driver circuit 514 and the inverted bitline driver circuit 516 connect to the shared boost capacitor 420, the driver circuit (either 514 or 516) driven to a logical zero is pulled down to the negative voltage caused by the shared boost capacitor 420 and therefore causes a negative voltage on the bitline $\overline{BL0}$. As previously discussed, the negative voltage on the bitline $\overline{BL0}$ allows a memory cell to change its logical state.

As previously described, in an exemplary embodiment, write assist circuits 502 are configured to share the shared boost capacitor 420 at the same time. During a write operation, when multiple write assist circuits share a negative voltage output by a boost capacitor, the negative voltage output to the write assist circuits is divided by the number of write assist circuits simultaneously sharing the negative voltage. For example, in regards to FIG. 5A, a negative voltage can be shared by both of the write assist circuits 502.1 and 502.2 during a write operation when the write assist enable control lines ast_en0 and ast_en1 are at logical ones. In this case, both the first and the second assist enable transistors 518.1 and 518.2 connect the first terminal of the shared boost capacitor 420 to both of the bitline driver circuits 514 and 516 of both of the write assist circuits 502.1 and 502.2. Accordingly, the negative voltage (e.g., −1V) from the first terminal of the shared boost capacitor 420 (node 554) is divided and shared by the bitline driver circuits 514 and 516 of both of the write assist circuits 502.1 and 502.2. Thus, each of the bitline driver circuits 514 and 516 that are driven to a logical zero on the write assist circuits 502.1 and 502.2 are pulled down to half of the negative voltage (e.g., −0.5V) output by the shared boost capacitor 420.

Alternatively, in an another exemplary embodiment, the shared boost capacitor 420 can be selectively coupled to the write assist circuit 502.1 or the write assist circuit 502.2. For example, the shared boost capacitor 420 can be selectively coupled to the write assist circuit 502.1 by toggling the write assist enable control line ast_en0 to the second logical value, such as a logical one to provide an example, and can be selectively decoupled from the write assist circuit 502.2 by toggling the write assist enable control line ast_en1 to the first logical value, such as a logical zero to provide an example. As another example, the shared boost capacitor 420 can be selectively decoupled from the write assist circuit 502.1 by toggling the write assist enable control line ast_en0 to the first logical value and can be selectively coupled to the write assist circuit 502.2 by toggling the write assist enable control line ast_en1 to the second logical value. In this way, write assist can be provided to selected columns of a memory device.

Figure 6:
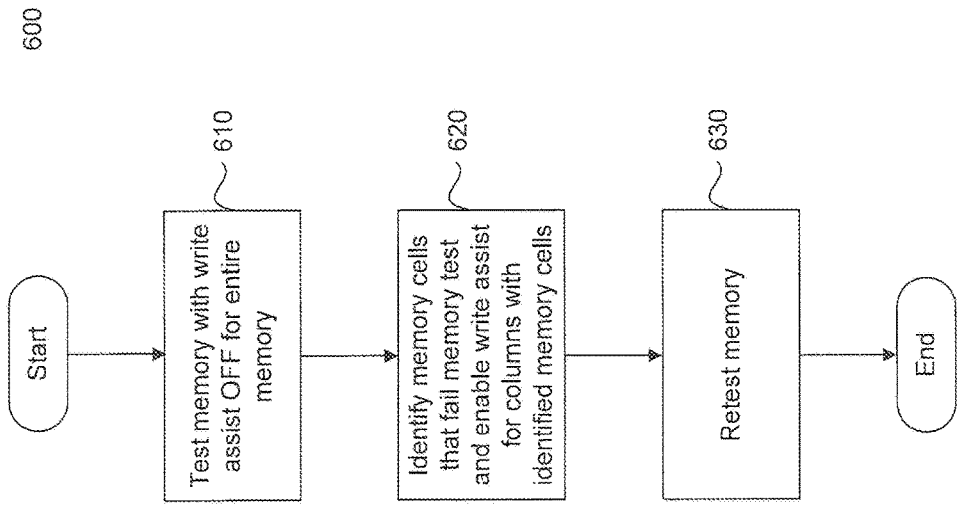
FIG. 6 illustrates a method of testing a memory device in accordance with one embodiment of the present disclosure.

In a memory device, not all columns of memory cells require the use of write assist. Accordingly, during a testing phase of a memory device, a memory test is performed to determine which columns of memory cells requires write assist. FIG. 6 illustrates a method 600 of testing a memory device in accordance with one embodiment of the present disclosure. When a memory device is designed in accordance to embodiments of the present disclosure, a write assist circuit (e.g., write assist circuits 400 or 500) is designed into the memory device. However, a determination on which memory cells in the memory device require the enablement of write assist may be required. Accordingly, a memory test is performed on the entire memory device without the use of write assist on the memory cells (i.e., write assist is disabled or off for all of the memory cells), at 610, to determine which cells require write assist. Based on the results of the memory test, write assist is enabled for the columns which correspond to memory cells that failed the memory test, at 620. After which, the memory device is retested, at 630, to determine whether the enablement of write assist on corresponding columns of the memory device resolves the failed write operations, and verifies whether the memory device is a good or bad device (i.e., it is determined whether to keep or discard the memory device).

CONCLUSION

The following Detailed Description referred to accompanying figures to illustrate exemplary embodiments consistent with the disclosure. References in the disclosure to "an exemplary embodiment" indicates that the exemplary embodiment described can include a particular feature, structure, or characteristic, but every exemplary embodiment can not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The exemplary embodiments described within the disclosure have been provided for illustrative purposes, and are not intend to be limiting. Other exemplary embodiments are possible, and modifications can be made to the exemplary embodiments while remaining within the spirit and scope of the disclosure. The disclosure has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Detailed Description of the exemplary embodiments fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based on the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A memory device, comprising:
   a plurality of columns of memory cells;
   a plurality of write assist circuits coupled to the plurality of columns of memory cells;
   a shared boost capacitor shared by the plurality of write assist circuits, the shared boost capacitor having a first terminal and a second terminal; and
   a boost switch circuit configured to selectively couple one or more first write assist circuits from among the plurality of write assist circuits to the first terminal of the shared boost capacitor,
   wherein the boost switch circuit comprises:
      a logic gate connected to the second terminal of the shared boost capacitor, the logic gate being configured to:
         receive an input from each one of the plurality of write assist circuits resulting in a plurality of inputs, and
         toggle a voltage on the second terminal of the shared boost capacitor to generate a negative voltage on the first terminal of the shared boost capacitor in response to the plurality of inputs indicating one or more first memory cells from among the plurality of columns of memory cells need write assistance; and
      a plurality of write assist enable transistors, each write assist enable transistor corresponding to one of the plurality of write assist circuits and independently controllable by a corresponding write assist control line, each write assist enable transistor configured to selectively connect and disconnect the negative voltage on the first terminal of the shared boost capacitor to bitlines of the corresponding write assist circuit based on a control signal on the corresponding write assist control line;
   wherein the selectively coupled one or more first write assist circuits are configured to cause the one or more first memory cells from among the plurality of columns of memory cells to change their logical states during a write operation using the negative voltage.

2. The memory device of claim 1, wherein each write assist circuit from among the plurality of write assist circuits is coupled to a corresponding column from among the plurality of columns of memory cells.

3. The memory device of claim 2, wherein the shared boost capacitor is configured to drive the corresponding column below zero volts.

4. The memory device of claim 1,
   wherein the plurality of columns of memory cells is coupled to a plurality of bit lines, and
   wherein the boost switch circuit is configured to couple the bitlines from among the plurality of bitlines of the selectively coupled one or more first write assist circuits to the shared boost capacitor.

5. The memory device of claim 4, wherein the shared boost capacitor is configured to drive the bitlines below zero volts.

6. The memory device of claim 1, wherein the boost switch circuit is configured to selectively couple a first write assist circuit from among the one or more first write assist circuits to the shared boost capacitor in response to a first control signal being at a first logical value, and
   wherein the boost switch circuit is configured to selectively couple a second write assist circuit from among the one or more first write assist circuits to the shared boost capacitor in response to a second control signal being at the first logical value, and wherein the boost switch circuit is further configured to simultaneously couple the first write assist circuit and the second write assist circuit to the shared boost capacitor in response to the first control signal and the second control signal being at the first logical value.

7. The memory device of claim 1, wherein the boost switch circuit is configured to selectively couple the one or more first write assist circuits to the shared boost capacitor in response to a first control signal being at a first logical value, and
wherein the boost switch circuit is configured to selectively decouple one or more second write assist circuits from among the plurality of write assist circuits from the shared boost capacitor in response to a second control signal being at a second logical value.

8. The memory device of claim 1, wherein the boost switch circuit is further configured to decouple one or more second write assist circuits from among the plurality of write assist circuits from the first terminal of the shared boost capacitor.

9. The memory device of claim 1, wherein the logic gate comprises:
a logical NOR gate having an output directly coupled to the shared boost capacitor.

10. A memory device, comprising:
a plurality of memory cells arranged into a plurality of rows and a plurality of columns;
a row decoder configured to access a row from among the plurality of rows;
a column decoder configured to access a column of the row from among the plurality of columns to select a memory cell from among the plurality of memory cells;
column circuitry configured to write data to the selected memory cell, the column circuitry comprising:
a plurality of write assist circuits coupled to the plurality of memory cells;
a shared boost capacitor shared by the plurality of write assist circuits, the shared boost capacitor having a first terminal and a second terminal; and
a boost switch circuit configured to selectively couple a write assist circuit corresponding to the selected memory cell from among the plurality of write assist circuits to the first terminal of the shared boost capacitor to provide write assistance to the selected memory cell,
wherein the boost switch circuit comprises:
a logic gate connected to the second terminal of the shared boost capacitor, the logic gate being configured to:
receive an input from each one of the plurality of write assist circuits resulting in a plurality of inputs, and
toggle a voltage on the second terminal of the shared boost capacitor to generate a negative voltage on the first terminal of the shared boost capacitor in response to the plurality of inputs indicating one or more first memory cells from among the plurality of columns of memory cells need write assistance; and
a plurality of write assist enable transistors, each write assist enable transistor corresponding to one of the plurality of write assist circuits and independently controllable by a corresponding write assist control line, each write assist enable transistor configured to selectively connect and disconnect the negative voltage on the first terminal of the shared boost capacitor to bitlines of the corresponding write assist circuit based on a control signal on the corresponding write assist control line;
wherein the selectively coupled write assist circuit is configured to cause the selected memory cell to change its logical state during a write operation using the negative voltage.

11. The memory device of claim 10, wherein the row decoder is configured to access the row by asserting one or more corresponding wordlines from among a plurality of wordlines.

12. The memory device of claim 10, wherein the column decoder is configured to access the column by asserting one or more corresponding bitlines of the selectively coupled write assist circuit.

13. The memory device of claim 12, wherein the boost switch circuit is configured to selectively couple the one or more corresponding bitlines to the shared boost capacitor to provide write assistance to the selected memory cell.

14. The memory device of claim 12, wherein the shared boost capacitor is configured to drive the one or more corresponding bitlines below zero volts.

15. The memory device of claim 10, wherein the boost switch circuit is configured to selectively couple the write assist circuit to the shared boost capacitor in response to a first control signal being at a first logical value or to decouple the write assist circuit from the shared boost capacitor in response to the first control signal being at a second logical value.

16. The memory device of claim 15, wherein the boost switch circuit comprises:
a transistor configured to selectively couple the write assist circuit to the shared boost capacitor when the first control signal is at the first logical value or to decouple the write assist circuit from the shared boost capacitor when the first control signal is at the second logical value.

17. A method of writing data to a memory cell from among a plurality of memory cells, the plurality of memory cells being arranged into a plurality of rows and a plurality of columns, the method comprising:
accessing a row from among the plurality of rows;
accessing a column of the row from among the plurality of columns to select the memory cell;
selectively coupling, by a write assist enable transistor, a write assist circuit corresponding to the memory cell from among the plurality of write assist circuits to a first terminal of a shared boost capacitor to provide write assistance to the memory cell, the shared boost capacitor being shared by the plurality of write assist circuits;
receiving by a logic gate connected to the shared boost capacitor, a plurality of inputs corresponding to the plurality of write assist circuits;
toggling, by the logic gate, a voltage on the second terminal of the shared boost capacitor to generate a negative voltage on the first terminal of the shared boost capacitor in response to the plurality of inputs indicating one or more first memory cells from among the plurality of columns of memory cells need write assistance; and
writing data to the memory cell utilizing the write assistance, the writing comprising:
causing the memory cell to change its logical state during a write operation using the negative voltage.

18. The method of claim 17, wherein the accessing the row comprises:

accessing the row by asserting one or more corresponding wordlines from among a plurality of wordlines, and wherein the accessing the column comprises:

accessing the column by asserting one or more corresponding bitlines from among a plurality of bitlines.

19. The method of claim 18, wherein the selectively coupling comprises:

coupling the one or more corresponding bitlines of the selectively coupled write assist circuit to the shared boost capacitor to provide the write assistance to the memory cell.

20. The method of claim 19, wherein the coupling the one or more corresponding bitlines comprises:

coupling the one or more corresponding bitlines of the selectively coupled write assist circuit to the shared boost capacitor to drive the one or more corresponding bitlines below zero volts.

\* \* \* \* \*